(12) United States Patent
Li

(10) Patent No.: US 9,857,448 B1
(45) Date of Patent: Jan. 2, 2018

(54) LEAKAGE CURRENT DETECTION DEVICE FOR APPLIANCES

(71) Applicant: Chengli Li, Suzhou (CN)

(72) Inventor: Chengli Li, Suzhou (CN)

( * ) Notice: Subject to any disclaimer, the term of this patent is extended or adjusted under 35 U.S.C. 154(b) by 20 days.

(21) Appl. No.: 15/209,563

(22) Filed: Jul. 13, 2016

(30) Foreign Application Priority Data

Jul. 5, 2016 (CN) .......................... 2016 1 0518704
Jul. 5, 2016 (CN) ..................... 2016 2 0694591 U

(51) Int. Cl.
*G01R 31/02* (2006.01)
*G08B 21/00* (2006.01)
*G01R 35/00* (2006.01)

(52) U.S. Cl.
CPC ......... *G01R 35/007* (2013.01); *G01R 31/025* (2013.01)

(58) Field of Classification Search
CPC ........................... G01R 35/007; G01R 31/025
USPC ........................ 324/424, 750.02; 340/664
See application file for complete search history.

(56) References Cited

U.S. PATENT DOCUMENTS

2012/0119918 A1* 5/2012 Williams ........... G01R 31/3277
340/664
2014/0117995 A1* 5/2014 Topucharla ............ H02H 3/335
324/424

\* cited by examiner

*Primary Examiner* — Farhana Hoque
(74) *Attorney, Agent, or Firm* — Chen Yoshimura LLP

(57) ABSTRACT

A leakage current detection device includes a self-test unit for activating a simulated leakage current signal; a leakage current detection unit for detecting the simulated leakage current signal and the actual leakage current signal, where when at least one of them is present, the leakage current detection unit activates a trigger signal, and when both of them are absent, the leakage current detection unit deactivates the trigger signal; a self-test feedback turnoff unit for detecting the trigger signal, where when the trigger signal is detected, the self-test feedback turnoff unit deactivates the simulated leakage current signal before a predetermined time point; and a power line disconnect unit for detecting the trigger signal after the predetermined time point, and when the trigger signal is detected, it disconnects the power between the power source and the load.

11 Claims, 4 Drawing Sheets

LEAKAGE CURRENT DETECTION DEVICE FOR APPLIANCES

BACKGROUND OF THE INVENTION

Field of the Invention

This invention relates to the field of electrical appliance and related circuitry, and in particular, it relates to a leakage current detection device and electrical connection device incorporating the leakage current detection device.

Description of the Related Art

Electrical appliances are widely used, and their safety is an important issue. Leakage current detection devices are provided for safety purposes. Leakage current detection devices that employ a relay and have both leakage current detection function and self test function are available.

SUMMARY OF THE INVENTION

In a leakage current detection devices that have both leakage current detection function and self test function, the self test signals sometimes interfere with actual leakage current signals. For example, the self test signals may be superimposed on the actual leakage current signals, or cancel out the actual leakage current signals. Embodiments of the present invention provide a leakage current detection device and electrical connection device incorporating the leakage current detection device that can avoid such undesirable effects, and can ensure that the leakage current detection function and the self test functions do not interfere with each other.

To achieve these and other advantages and in accordance with the purpose of the present invention, in a first aspect, the present invention provides a leakage current detection device connected between a power source end and a load end, which includes: a self-test unit for activating a simulated leakage current signal; a leakage current detection unit for detecting the simulated leakage current signal and an actual leakage current signal, wherein when at least one of the simulated leakage current signal and the actual leakage current signal is present, the leakage current detection unit activates a trigger signal, and when both the simulated leakage current signal and the actual leakage current signal are absent, the leakage current detection unit deactivates the trigger signal; a self-test feedback turnoff unit for detecting the trigger signal, wherein when the trigger signal is detected, the self-test feedback turnoff unit deactivates the simulated leakage current signal before a predetermined time point; and a power line disconnect unit for detecting the trigger signal after the predetermined time point, and for disconnecting a connection between the power source end and the load end when the trigger signal is detected.

Using the above structure, the detection of the actual leakage current occurs after the simulated leakage current is deactivated, and based on such detection, the power source is disconnected. Therefore, the simulated leakage current will not interfere with the actual leakage current, which improves the reliability of the device and improves safety.

In one embodiment, the self-test unit periodically activates the simulated leakage current signal. This accomplishes periodic self test of the circuit.

In one embodiment, the self-test unit includes: a reference voltage generating sub-unit, for generating a reference voltage; a periodic voltage generating sub-unit, for generating a periodically varying voltage, which is below the reference voltage during some parts of each period and above the reference voltage during other parts of each period; a comparator, for comparing the reference voltage and the periodically varying voltage; and a first transistor, for generating a simulated leakage current signal based on a comparison result output by the comparator.

In one embodiment, the periodic voltage generating sub-unit includes a first resistor and a first capacitor connected in series.

In one embodiment, the self-test feedback turnoff unit includes a second transistor, wherein a control electrode of the second transistor is connected to the leakage current detection unit, and wherein an anode to cathode path of the second transistor is connected in parallel to the first capacitor. This way, the turning off of the second transistor deactivates the simulated leakage current.

In one embodiment, the self-test unit further includes a self-test fault activation sub-unit for activating a self-test fault signal when a self-test fault occurs; and the power line disconnect unit disconnects the connection between the power source end and the load end when the self-test fault signal is activated. This way, the power source can be disconnected when self test faults occur.

In one embodiment, the leakage current detection unit includes: a detector coil for detecting the simulated leakage current and the actual leakage current; and a processor for activating or deactivating the trigger signal based on a detection result of the detection coil.

In one embodiment, the power line disconnect unit includes a delay sub-unit for delaying the detection of the trigger signal until after the predetermined time point. This way, the detection of the trigger signal by the power line disconnect unit is delayed, so that there is sufficient time to deactivate the simulated leakage current signal before the detection of the trigger signal occurs.

In one embodiment, the delay sub-unit is an RC circuit. This can achieve the delay using a simple structure.

In one embodiment, the power line disconnect unit includes a trip solenoid or a relay.

In one embodiment, the power line disconnect unit further includes at least one transistor for activating or deactivating the trip solenoid or the relay.

In a second aspect, the present invention provides an electrical connection device that employs the above leakage current detection device.

In summary, embodiments of the present invention can separate the self test function and the leakage current detection function in the time domain, in order to prevent the simulated leakage signal from interfering with the actual leakage signal. As a result, the leakage current detection device can more accurately detect actual leakage current signals, which improves safety.

BRIEF DESCRIPTION OF THE DRAWINGS

Embodiments of the invention are described with reference to the following drawings.

In the figures, same or similar components are designated with same or similar reference symbols.

DETAILED DESCRIPTION OF THE PREFERRED EMBODIMENTS

Embodiments of the present invention are described with reference to the drawings. It will be apparent to those skilled in the art that various modification and variations can be made in the leakage current detection devices of the present invention without departing from the spirit or scope of the invention. Thus, it is intended that the present invention cover modifications and variations that come within the scope of the appended claims and their equivalents.

Figure 1:
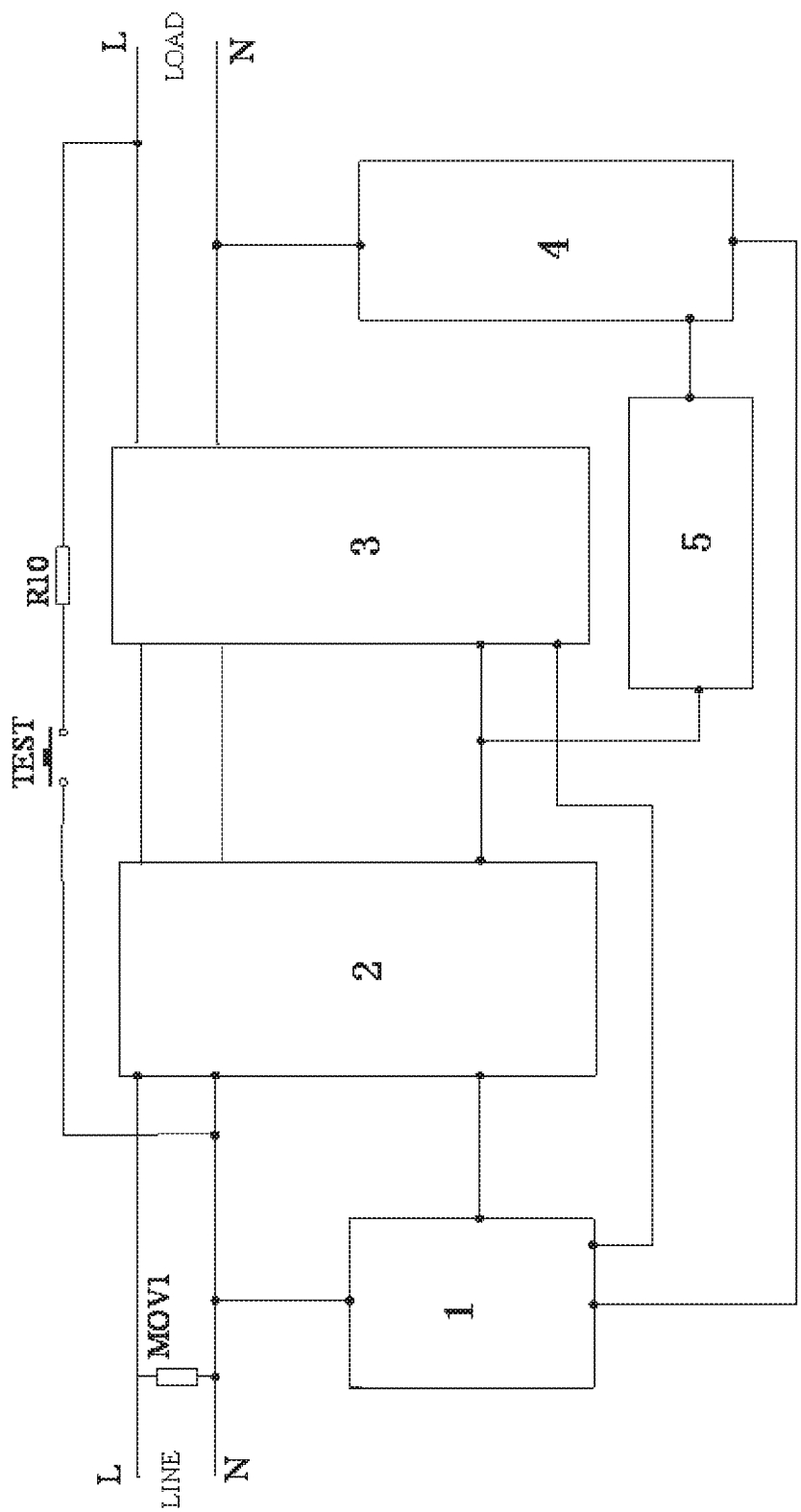
FIG. 1 is a schematic block diagram showing the structure of a leakage current detection device according to embodiments of the present invention.

FIG. 1 is a schematic block diagram showing the structure of a leakage current detection device according to embodiments of the present invention.

As shown in FIG. 1, the leakage current detection device includes a power supply unit 1, a power line disconnect unit 2, a leakage current detection unit 3, a self-test unit 4, and a self-test feedback turnoff unit 5.

The self-test unit 4 activates a simulated leakage current signal.

The leakage current detection unit 3 detects the simulated leakage current signal and the actual leakage current signal. When at least one of the simulated leakage current signal and actual leakage current signal is present, the leakage current detection unit 3 activates a trigger signal; when both the simulated leakage current signal and actual leakage current signal are absent, the leakage current detection unit 3 deactivates the trigger signal.

The self-test feedback turnoff unit 5 detects the trigger signal. When the trigger signal is detected, the self-test feedback turnoff unit 5 deactivates the simulated leakage current signal before a predetermined time point and keeps it deactivated.

The power line disconnect unit 2 detects the trigger signal after the predetermined time point, and when the trigger signal is detected, disconnects the connection between the power source (LINE) and the load (LOAD).

Figure 2:
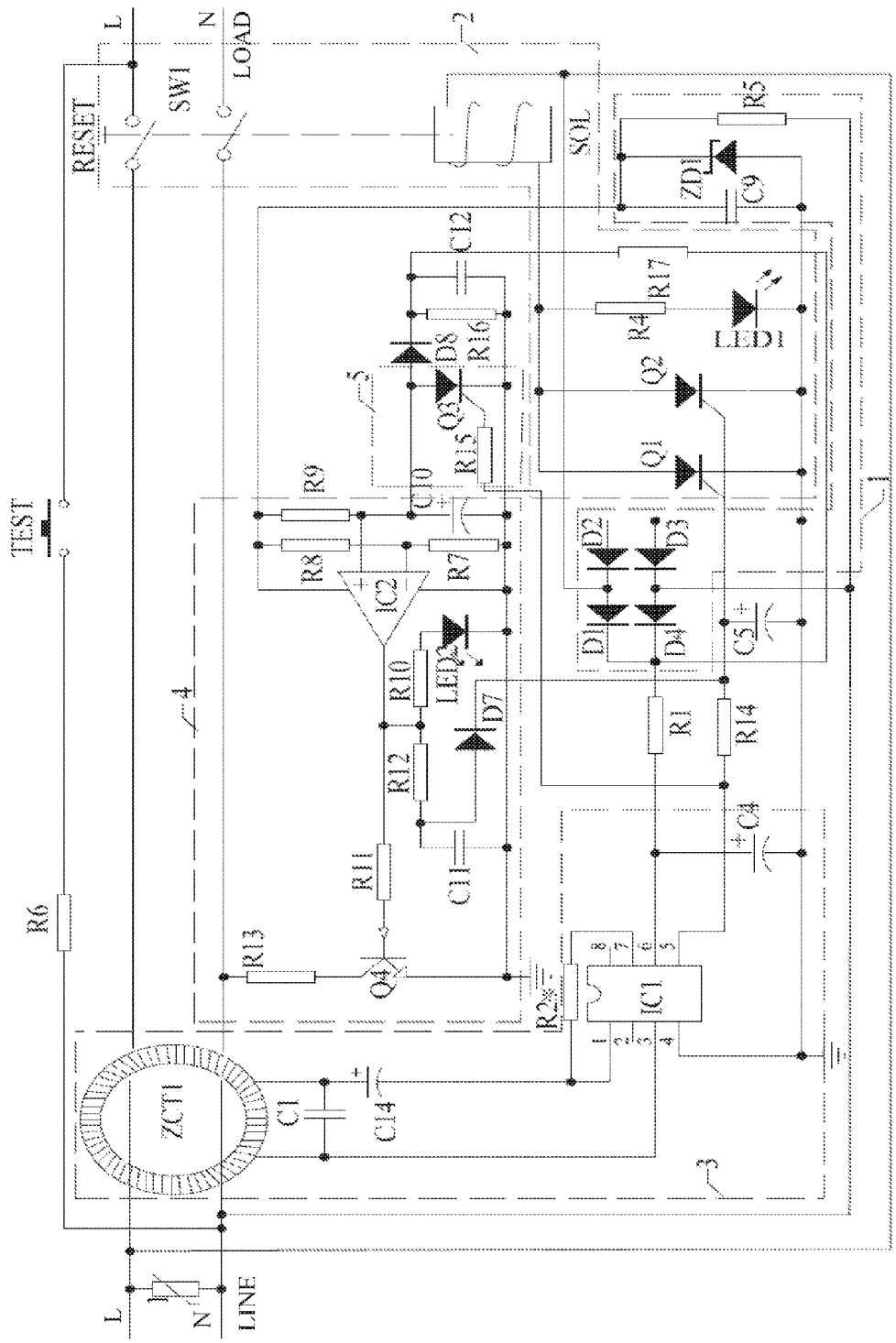
FIG. 2 is a circuit diagram of a leakage current detection device according to a first embodiment of the present invention.

FIG. 2 is a circuit diagram of a leakage current detection device according to a first embodiment of the present invention.

As shown in FIG. 2, the power line disconnect unit 2 includes: a trip solenoid SOL, power switch SW1, silicon-controlled rectifiers (SCR) Q1 and Q2, resistor R4, and light emitting diode LED1 connected as shown. It should be understood that the SCR Q1 may be replaced by other devices that have a switching function, such as MOS transistors. Here, two redundant SCRs Q1 and Q2 are used to ensure that the trip solenoid SOL is activated and the power switch SW1 disconnects the power lines. Other numbers of SCRs may be used.

The leakage current detection unit 3 includes: a detector coil ZCT1 and processor chip IC1 connected as shown.

The self-test unit 4 includes: reference voltage generating sub-unit, a periodic voltage generating sub-unit, a comparator IC2, and a first transistor Q4 connected as shown. The reference voltage generating sub-unit generates a reference voltage. The periodic voltage generating sub-unit generates a periodically varying voltage, which is below the reference voltage during some parts of the period and above the reference voltage during other parts of the period. The comparator compares the reference voltage and the periodically varying voltage. The first transistor Q4 generates a simulated leakage current signal based on the comparison result output by the comparator. In the circuit of FIG. 2, the reference voltage generating sub-unit includes a voltage divider circuit formed by resistors R7 and R8. The periodic voltage generating sub-unit includes serially connected first resistor R9 and first capacitor C10. The simulated leakage current signal is a leakage current on the neutral line N greater than a leakage threshold value.

The self-test feedback turnoff unit 5 includes: a second transistor Q3 and a resistor R15 connected to the control electrode of the transistor Q3 as shown. The control electrode of the second transistor Q3 is connected to the leakage current detection unit 3 via the resistor R15. The anode to cathode path of the second transistor Q3 is connected in parallel to the capacitor C10.

In the circuit of FIG. 2, the detector coil ZCT1 is coupled at its two ends to pin 1 and pin 4 of the processor IC1. When the output voltage change of the detector coil ZCT1 is greater than a threshold voltage value, the processor IC1 outputs a high voltage level at its pin 5; otherwise it outputs a low voltage at pin 5. The rectifier bridge circuit D1-D4 is connected to the hot line L and neutral line N of the power lines, and connected to the pin 6 of the processor IC1 via resistor R1, to supply working power to the processor IC1 during both positive and negative half-cycles of the AC current of the power lines.

In some embodiments, the leakage current detection device further includes a power supply unit 1 for supplying power to the leakage current detection device. The power supply unit 1 includes the rectifier bridge circuit D1-D4.

In some embodiments, the self-test unit 4 further includes a self-test fault activation sub-unit, which includes, for example, resistor R12 and capacitor C11 connected as shown. When a self-test fault occurs, the capacitor C11 is continuously charged via the resistor R12, to activate a self-test fault signal. The power line disconnect unit 2 can disconnect the power lines based on the self-test fault signal.

In some embodiments, the power line disconnect unit 2 includes a delay sub-unit, which may be implemented by, for example, an RC circuit formed by resistor R14 and capacitor C5 connected as shown.

When the reset switch RESET is reset, the power lines L and N are energized, and the waveform of the AC current between the hot line L and neutral line L is a sine wave.

The working principle of the power line disconnect unit 2, the leakage current detection unit 3, the self-test unit 4 and the self-test feedback turnoff unit 5 is described below.

During normal operation, an actual leakage current is not present. In this situation, when the power switch SW1 is closed, the power source side LINE and the load side LOAD are electrically connected. When the power source supplies power to the power lines, the self-test unit 4 charges the first capacitor C10 via the first resistor R9. When the charge on the capacitor C10 is higher than the predetermined voltage at the negative input of the comparator IC2, the comparator IC2 flips and outputs a high voltage level, causing the first transistor Q4 to become conductive. When the first transistor Q4 is conductive, it provides a simulated leakage current signal to the detector coil ZCT1, and as a result pin 5 of the processor IC1 outputs a trigger signal. All of transistors Q1, Q2 and Q3 receive this trigger signal; however, the second transistor Q3 will become conductive first, while transistor Q1 and Q2 will become conductive later due to the delay caused by resistor R14 and capacitor C5. When the second transistor Q3 becomes conductive, the first capacitor C10 is shorted, so that the voltage on capacitor C10 drops rapidly.

As a result, the voltage on the positive input of comparator IC2 drops, causing comparator IC2 to turn off (flip to a lower voltage). This in turn causes the first transistor Q4 to turn off, and therefore the leakage current detection unit 3 is no longer provided with a simulated leakage current signal. When the comparator IC2 is off, pin 5 of the processor IC1 also stops the activation of the trigger signal, so that the second transistor Q3 is off. The first resistor R9 of the self-test unit 4 against starts to charge the first capacitor C10, which starts the next period of self test.

When a leakage current is present, the detector coil ZCT1 detects the leakage current, and pin 5 of the processor IC1 outputs a trigger signal. At this time, the second transistor Q3 becomes conductive before transistors Q1 and Q2. Therefore, when both the simulated leakage current and the actual leakage current are present, because the second transistor Q3 becomes conductive first, comparator IC2 will be off, so as to avoid interference effect of the simulated leakage current on the actual leakage current. The transistor Q1 and Q2 becomes conductive after the simulated leakage current is deactivated. As a result, the trip solenoid SOL is energized, the power switch SW1 is open, which disconnects the connection between the power source side LINE and load side LOAD to protect user's safety.

When a self test fault is present, for example, when the capacitor C1 or the detector coil ZCT1 is shorted, when the first resistor R9 charges the first capacitor C10 to a level higher than the voltage at the negative input of the comparator IC2, comparator IC2 outputs a high voltage, causing the first transistor Q4 to become conductive. However, because the capacitor C1 or the detector coil ZCT1 is shorted, the detector coil ZCT1 cannot detect the simulated leakage current, so pin 5 of the processor IC1 still outputs a low voltage level, and the second transistor Q3 does not become conductive. Therefore, the voltage at the first capacitor C10 will remain higher than the voltage at the negative input of the comparator IC2, and comparator IC2 will continue to output a high voltage level. At this time, resistor R12 charges capacitor C11, and diode D7 becomes conductive, which triggers transistors Q1 and Q2 to become conductive. Thus, the trip solenoid SOL is energized, the power switch SW1 is open, which disconnects the connection between the power source side LINE and load side LOAD.

Figure 3:
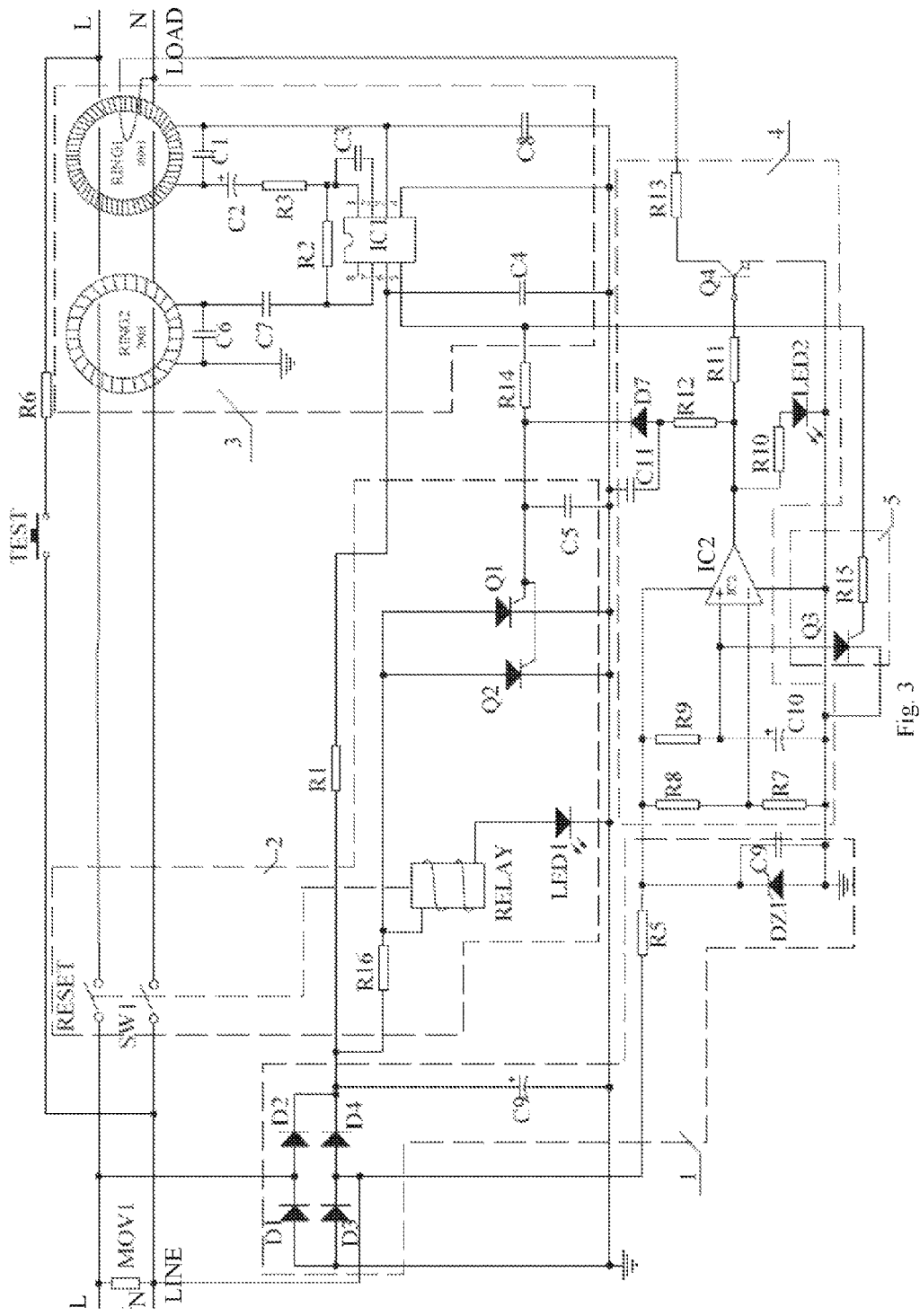
FIG. 3 is a circuit diagram of a leakage current detection device according to a second embodiment of the present invention.

FIG. 3 is a circuit diagram of a leakage current detection device according to a second embodiment of the present invention. Main differences between the embodiment of FIG. 3 and the embodiment of FIG. 2 are that a relay is used to replace the trip solenoid SOL, and that two detector coils RING1 and RING2 are used. Using two detector coils improves the accuracy of leakage current detection.

Figure 4:
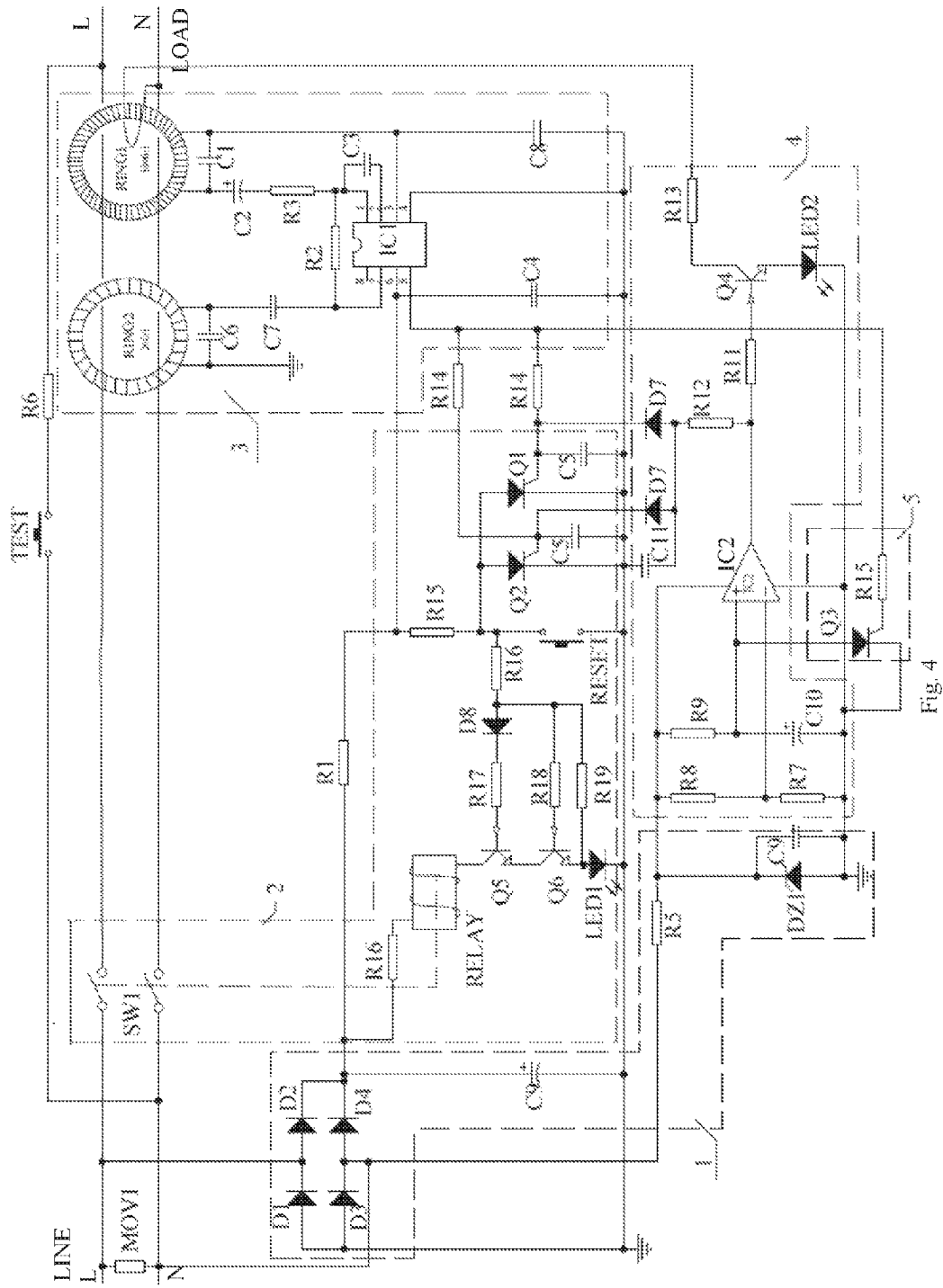
FIG. 4 is a circuit diagram of a leakage current detection device according to a third embodiment of the present invention.

FIG. 4 is a circuit diagram of a leakage current detection device according to a second embodiment of the present invention. A main difference between the embodiment of FIG. 4 and the embodiment of FIG. 3 is that a manual reset circuit is added. Thus, when the power is disconnected due to self test fault or leakage current, the manual reset may be used to close the reset switch RESET to resume normal operation of the device.

It will be apparent to those skilled in the art that various modification and variations can be made in the leakage current detection circuit of the present invention without departing from the spirit or scope of the invention. Thus, it is intended that the present invention cover modifications and variations that come within the scope of the appended claims and their equivalents.

What is claimed is:

1. A leakage current detection device connected between a power source end and a load end, comprising:
   a self-test unit for periodically activating a simulated leakage current signal;
   a leakage current detection unit for detecting the simulated leakage current signal and an actual leakage current signal, wherein when at least one of the simulated leakage current signal and the actual leakage current signal is present, the leakage current detection unit activates a trigger signal, and when both the simulated leakage current signal and the actual leakage current signal are absent, the leakage current detection unit deactivates the trigger signal;
   a self-test feedback turnoff unit for detecting the trigger signal, wherein when the trigger signal is detected, the self-test feedback turnoff unit deactivates the simulated leakage current signal before a predetermined time point; and
   a power line disconnect unit for detecting whether the trigger signal is present after the predetermined time point, and for disconnecting a connection between the power source end and the load end when the trigger signal is detected after the predetermined time point.

2. The leakage current detection device of claim 1, wherein the self-test unit comprises:
   a reference voltage generating sub-unit, for generating a reference voltage;
   a periodic voltage generating sub-unit, for generating a periodically varying voltage, which is below the reference voltage during some parts of each period and above the reference voltage during other parts of each period;
   a comparator, for comparing the reference voltage and the periodically varying voltage; and
   a first transistor, for generating a simulated leakage current signal based on a comparison result output by the comparator.

3. The leakage current detection device of claim 2, wherein the periodic voltage generating sub-unit includes a first resistor and a first capacitor connected in series.

4. The leakage current detection device of claim 3, wherein the self-test feedback turnoff unit includes a second transistor, wherein a control electrode of the second transistor is connected to the leakage current detection unit, and wherein an anode to cathode path of the second transistor is connected in parallel to the first capacitor.

5. The leakage current detection device of claim 1, wherein the self-test unit further comprises a self-test fault activation sub-unit for activating a self-test fault signal when a self-test fault occurs; and
   wherein the power line disconnect unit disconnects the connection between the power source end and the load end when the self-test fault signal is activated.

6. The leakage current detection device of claim 1, wherein the leakage current detection unit comprises:
   a detector coil for detecting the simulated leakage current and the actual leakage current; and
   a processor for activating or deactivating the trigger signal based on a detection result of the detection coil.

7. The leakage current detection device of claim 1, wherein the power line disconnect unit comprises a delay sub-unit for delaying the detection of the trigger signal until after the predetermined time point.

8. The leakage current detection device of claim 7, wherein the delay sub-unit is an RC circuit.

9. The leakage current detection device of claim 1, wherein the power line disconnect unit comprises a trip solenoid or a relay.

10. The leakage current detection device of claim 9, wherein the power line disconnect unit further comprises at least one transistor for activating or deactivating the trip solenoid or the relay.

11. An electrical connection device comprising the leakage current detection device of claim 1.

* * * * *